United States Patent
Nguyen et al.

(10) Patent No.: US 9,646,843 B2
(45) Date of Patent: May 9, 2017

(54) TUNABLE MAGNETIC FIELD TO IMPROVE UNIFORMITY

(71) Applicant: Applied Materials, Inc., Santa Clara, CA (US)

(72) Inventors: Andrew Nguyen, San Jose, CA (US); Tza-Jing Gung, San Jose, CA (US); Haitao Wang, Sunnyvale, CA (US); Maxim Mikhailovich Noginov, Sunnyvale, CA (US); Reza Sadjadi, San Jose, CA (US); Chunlei Zhang, Santa Clara, CA (US); Xue Yang, San Mateo, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/829,662

(22) Filed: Aug. 19, 2015

(65) Prior Publication Data

US 2016/0163511 A1    Jun. 9, 2016

Related U.S. Application Data

(60) Provisional application No. 62/103,159, filed on Jan. 14, 2015, provisional application No. 62/088,829, filed on Dec. 8, 2014.

(51) Int. Cl.

| | |
|---|---|
| H01J 37/32 | (2006.01) |
| H01L 21/3065 | (2006.01) |
| C23C 16/50 | (2006.01) |
| C23C 16/455 | (2006.01) |
| C23C 14/22 | (2006.01) |
| H01L 21/02 | (2006.01) |

(52) U.S. Cl.
CPC .......... *H01L 21/3065* (2013.01); *C23C 14/22* (2013.01); *C23C 16/45565* (2013.01); *C23C 16/50* (2013.01); *H01J 37/32082* (2013.01); *H01J 37/32669* (2013.01); *H01L 21/02274* (2013.01)

(58) Field of Classification Search
CPC .............. H01J 37/3455; H01J 37/3408; H01J 37/3452; H01J 37/20; H01J 37/32082; H01J 37/32623; H01J 37/3266; H01J 37/32935; H01J 37/3299; H01J 37/3405
USPC ........... 204/192.12, 192.13, 192.15, 192.17, 204/298.16, 298.19, 298.2, 298.26, 204/298.28; 438/732
See application file for complete search history.

(56) References Cited

U.S. PATENT DOCUMENTS

| | | | |
|---|---|---|---|
| 6,132,632 A * | 10/2000 | Haney ................ | H01J 37/3266 216/67 |
| 6,632,324 B2 * | 10/2003 | Chan ...................... | H01J 37/20 118/723 I |
| 8,956,512 B2 * | 2/2015 | Mizuno .................. | C23C 14/35 204/192.12 |
| 2006/0065525 A1 * | 3/2006 | Weichart ................ | C23C 14/35 204/298.28 |

(Continued)

*Primary Examiner* — William F Kraig
*Assistant Examiner* — Edward Chin
(74) *Attorney, Agent, or Firm* — Patterson + Sheridan, LLP (57) ABSTRACT

Implementations described herein provide a magnetic ring which enables both lateral and azimuthal tuning of the plasma in a processing chamber. In one embodiment, the magnetic ring has a body. The body has a top surface and a bottom surface, and a plurality of magnets are disposed on the bottom surface of the body.

16 Claims, 8 Drawing Sheets

(56) References Cited

U.S. PATENT DOCUMENTS

2015/0075970 A1\* 3/2015 Miller ................. H01J 37/3452
                                                                                                204/192.12
2016/0230269 A1\* 8/2016 Raj ......................... C23C 14/50

\* cited by examiner

TUNABLE MAGNETIC FIELD TO IMPROVE UNIFORMITY

CROSS-REFERENCE TO RELATED APPLICATIONS

This application claims benefit of U.S. Provisional Application Ser. No. 62/103,159, filed Jan. 14, 2015 and U.S. Provisional Application Ser. No. 62/088,829, filed Dec. 8, 2014, both of which are incorporated by reference in their entirety.

BACKGROUND

Field

Implementations described herein generally relate to semiconductor manufacturing and more particularly to a device and method for controlling a profile of a plasma in the semiconductor chamber.

Description of the Related Art

As the feature size of the device patterns get smaller and smaller, the critical dimension (CD) requirements for these features become a more important criteria for obtaining stable and repeatable device performance. Maintaining surface uniformity for a substrate, in which the features are formed in, facilitates achieving the critical dimensions for these features. In plasma processing, surface uniformity for a layer of the substrate deposited and/or etched is challenging due to the non-homogeneous profile of the plasma processing the substrate. The non-homogeneous profile of the plasma may be due to chamber asymmetries such as chamber and substrate temperature, flow conductance, chamber pumping and non-uniform RF fields, among other factors.

Achieving the allowable variations in the CD across a substrate is difficult when processed by a plasma reactor due to the non-homogeneous profile of the plasma. For example, some regions of the plasma may have greater concentration of reactive ions and result in greater etch or deposition rates for the substrate in that region while other regions may be starved of reactive ions, i.e., has a lower density, resulting in lower etch or deposition rates. Thus, the non-homogeneous plasma profile leads to non-uniformity in the surface of the substrate resulting in CD which may become out of specification.

Thus, there is a need for improving the uniformity of the surface for a substrate undergoing plasma processing.

SUMMARY

Implementations described herein provide a magnetic ring which enables both lateral and azimuthal tuning of the plasma in a processing chamber. In one embodiment, the magnetic ring has a body. The body has a top surface and a bottom surface, and a plurality of magnets are disposed on the bottom surface of the body. The magnets are configured to generate a non-uniform magnetic field with respect to a centerline of the ring.

In another embodiment, a processing chamber is provided. The processing chamber has a lid, bottom and walls defining an interior processing region. A showerhead is disposed under the lid in the interior processing region, wherein the showerhead is configured to support a plasma within the interior processing region. An electrostatic chuck (ESC) is disposed in the chamber body. A magnetic ring is disposed on the lid. The magnetic ring has a body. The body has a top surface and a bottom surface, and a plurality of magnets are disposed on the bottom surface of the body. The magnets are configured to generate a non-uniform magnetic field with respect to a centerline of the ring.

In yet another embodiment, a method for processing a substrate using a magnetic ring to tune a plasma profile is provided. The method includes applying power to a showerhead to maintain a plasma in an interior processing region. Adjusting a magnetic field in the interior processing region with a magnetic ring. Tuning a plasma profile with the magnetic field and processing the substrate with the tuned plasma profile.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

As the semiconductor industry is reducing the electronic feature sizes to sub-nm levels, the etch rate and CD uniformity requirements are also shrinking to Angstrom levels which is nearing atomic sizes. In such cases, greater ion density in the plasma can increase the etch rate and vice versa. Thus, controlling plasma ion density, i.e., a profile of the plasma, is an important process control parameter which disclosed herein has been demonstrated for tailoring the lateral and/or azimuthal uniformity and/or CD control for a substrate.

Implementations described herein provide a magnetic ring which produces a non-uniform magnetic field that enables local, lateral and azimuthal tuning of the plasma profile in the processing chamber. The tuned plasma profile allows both lateral and azimuthal tuning of the surface profile of a substrate undergoing plasma processing in the processing chamber. Moreover, the control of local variations in the plasma profile substantially enhances the processes performed in the processing chamber by eliminating or, in some cases, inducing process variations influenced by the profile of the plasma on the substrate. Thus, the magnetic ring enables angstrom-level etch rates and depositions while maintaining critical dimension (CD) uniformity control between almost any locations across the substrate.

Although the magnetic ring is described below in an etch processing chamber, the magnetic ring may be utilized in other types of plasma processing chambers, such as physical vapor deposition chambers, chemical vapor deposition chambers, ion implantation chambers, among others, as well as other systems where at least one of azimuthal, lateral and/or local tuning of the plasma profile is desirable.

Figure 1:
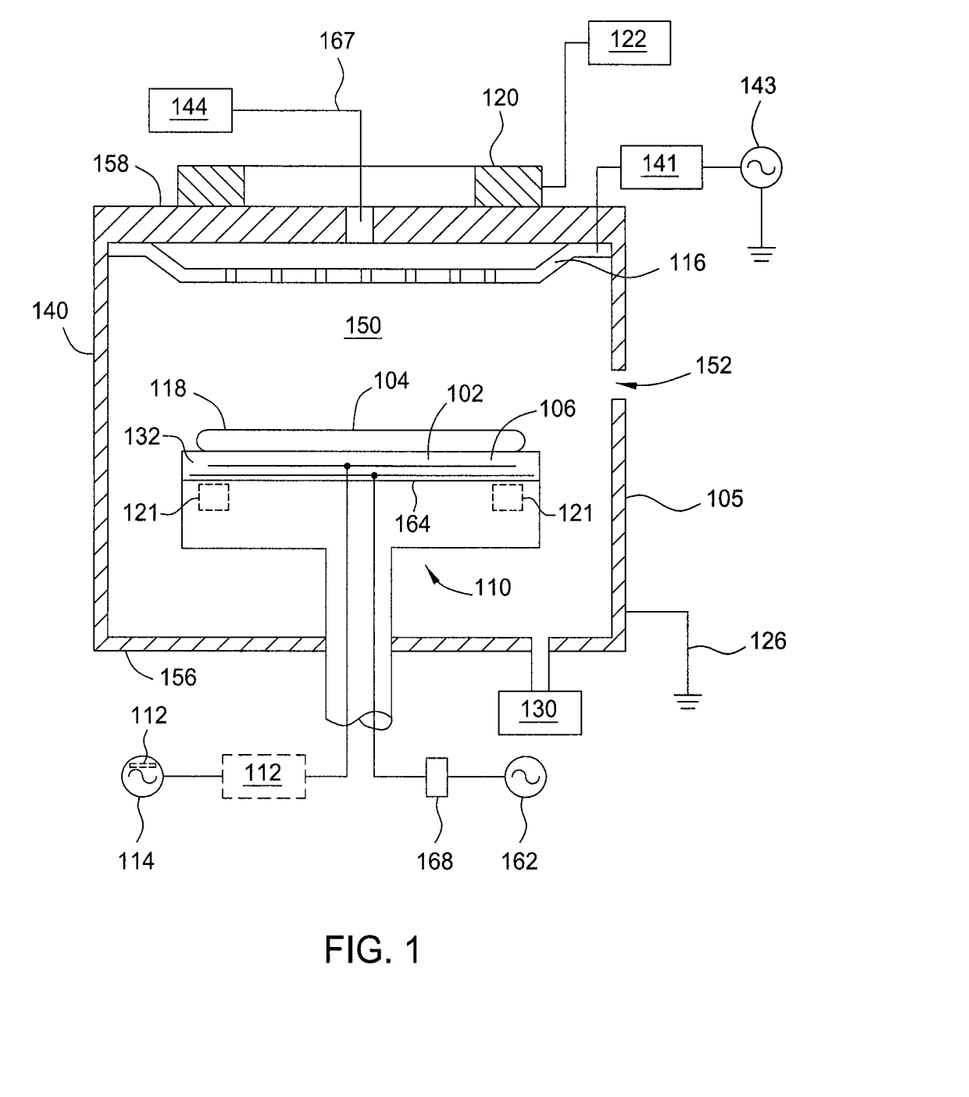
FIG. 1 is a schematic side view of one embodiment of a vacuum processing chamber having a tunable magnetic field.

FIG. 1 shows a schematic side view of one embodiment of a vacuum processing chamber 100 having a tunable magnetic field. The processing chamber 100 may be a chemical vapor deposition (CVD) processing chamber, hot wire chemical vapor deposition (HWCVD) processing chamber, PRODUCER® etch process chamber, or other vacuum chamber for processing substrates at elevated temperatures.

The processing chamber 100 includes a chamber body 105 having a top 158, chamber sidewalls 140 and a chamber bottom 156 which are coupled to a ground 126. The top 158, the chamber sidewalls 140 and the chamber bottom 156 define an interior processing region 150. The chamber sidewalls 140 may include a substrate transfer port 152 to facilitate transferring a substrate 118 into and out of the processing chamber 100. The substrate transfer port 152 may be coupled to a transfer chamber and/or other chambers of a substrate processing system.

The dimensions of the chamber body 105 and related components of the processing chamber 100 are not limited and generally are proportionally larger than the size of the substrate 118 to be processed therein. Examples of substrate sizes include 200 mm diameter, 250 mm diameter, 300 mm diameter and 450 mm diameter, among others.

The substrate support assembly 110 is disposed above the bottom 156 of the processing chamber 100 and holds the substrate 118 during processing operations. The substrate support assembly 110 has a body 102. The body 102 may include an electrostatic chuck (ESC) 132 for chucking the substrate 118 disposed thereon. The body 102 may also be coupled to a cooling base, not shown, for controlling the temperature of the body 102 and substrate 118 supported thereon.

The substrate support assembly 110 may also include one or more resistive heaters 164 embedded in the body 102 of the substrate support assembly 110. The resistive heaters 164 may be disposed in the ESC 132, or any other suitable portion of the body 102. The resistive heaters 164 may be provided to elevate the temperature of the substrate support assembly 110 to a temperature for conducting chamber processes. The resistive heaters 164 are coupled through an RF filter 168 to a main heater power source 162. The main heater power source 162 may provide 500 watts or more power to the resistive heaters 164.

The ESC 132 is configured for chucking the substrate 118 disposed thereon. The ESC 132 secures the substrate 118 to the substrate support assembly 110 during processing. The ESC 132 may be formed from a dielectric material, for example a ceramic material, such as aluminum nitride (AlN) among other suitable materials. The ESC 132 uses the electro-static attraction to hold the substrate 118 to the substrate support assembly 110. The ESC 132 includes a chucking electrode 106 connected to a power source 114 through an isolation transformer 112 disposed between the power source 114 and the chucking electrode 106. The isolation transformer 112 may be part of the power source 114 or separate from the power source 114, as shown by the dashed lines in FIG. 1. The power source 114 may apply a chucking voltage between about 50 Volts and about 5000 Volts to the chucking electrode 106. Optionally, negative voltage may be applied for lower power consumption. The ESC 132 may have a coating or layer attached thereto configured to inhibit current leakage at operational temperatures ranging from about 10 degrees Celsius to about 150 degrees Celsius.

Optionally, the substrate support assembly 110 may be moved up or down for tuning the process uniformity of the substrate 118 placed thereon. The substrate support assembly 110 may optionally have a lower magnet array 121 disposed therein. The lower magnet array 121 may have one or more magnets. Magnets comprising the lower magnet array 121 may be electromagnets and/or permanent magnets. The lower magnet array 121 is configured to tune/alter the magnetic field around the substrate support. The magnetic field may be used to alter the plasma and thus the processing results on the substrate 118 disposed on the substrate support assembly 110.

A pumping device 130 is coupled to the bottom 156 of the processing chamber 100 to evacuate and control the pressure with the processing chamber 100. The pumping device 130 may be a conventional roughing pump, roots blower, turbo pump or other similar device that is adapted control the pressure in the interior processing region 150. In one example, the pressure level of the interior processing region 150 of the processing chamber 100 may be maintained at less than about 760 Torr.

A gas panel 144 supplies process and other gases through a gas line 167 into the interior processing region 150 of the chamber body 105. The gas panel 144 may be configured to provide one or more process gas sources, inert gases, non-reactive gases, and reactive gases, if desired. Examples of process gases that may be provided by the gas panel 144 include, but are not limited to, a silicon (Si) containing gases, carbon precursors and nitrogen containing gases. Examples of Si containing gases include Si-rich or Si-deficient nitride ($Si_xN_y$) and silicon oxide ($SiO_2$). Examples of carbon precursors include propylene, acetylene, ethylene, methane, hexane, hexane, isoprene, and butadiene, among others. Examples of Si containing gases include silane (SiH4), tetraethyl orthosilicate (TEOS). Examples of nitrogen containing gases include pyridine, aliphatic amine, amines, nitriles, and ammonia, among others.

A showerhead 116 is disposed below the top 158 of the processing chamber 100 and is spaced above a substrate support assembly 110 disposed in the interior processing region 150 and configured to support the substrate 118 thereon. As such, the showerhead 116 is directly above a top surface 104 of the substrate 118 when positioned on the substrate support assembly 110 for processing. One or more process gases provided from the gas panel 144 may supply reactive species through the showerhead 116 into the interior processing region 150.

The showerhead 116 is configured to support a plasma within the interior processing region 150. The showerhead 116 may function as an electrode for coupling power to gases within the interior processing region 150. It is contemplated that power may be coupled to the gases within the interior processing region 150 utilizing other electrodes or devices. In the embodiment depicted in FIG. 1, a power supply 143 may be coupled through a match circuit 141 to the showerhead 116. The RF energy applied to the showerhead 116 from the power supply is inductively coupled to the process gases disposed in the interior processing region 150 to maintain a plasma in the processing chamber 100. Alternatively, or in addition to the power supply 143, power may be capacitively coupled to the process gases in the interior processing region 150 to maintain the plasma within the interior processing region 150. The operation of the power supply 143 may be controlled by a controller 122 that may also control the operation of other components in the processing chamber 100.

An upper magnetic ring 120 may be disposed above the top 158 of the processing chamber 100. The upper magnetic ring 120 generates a non-uniform magnetic field with respect to a centerline of the upper magnetic ring 120. The non-uniform magnetic field of the upper magnetic ring 120 is configured to tune the magnetic field within the interior processing region 150. The magnetic field may be configured to alter the plasma profile in the interior processing region 150. The upper magnetic ring 120 may generate a discrete, or continuous, or another suitable magnetic field to adjust the plasma profile for a desired processing result. The upper magnetic ring 120 may have permanent magnets, electromagnets, or other means for generating a magnetic field. The magnetic field may influence the rate of etch or deposition for a substrate 118 undergoing plasma processing. For example, a higher magnetic field may attract plasma ions to skew the plasma field toward an edge or other area of a substrate 118. The upper magnetic ring 120 controls variations in the plasma profile in the processing environment to achieve a desired processing uniformity of the substrate 118 to less than about 10%, resulting in control of process deviations in layer uniformities down to about 5 Å.

Figure 2A:
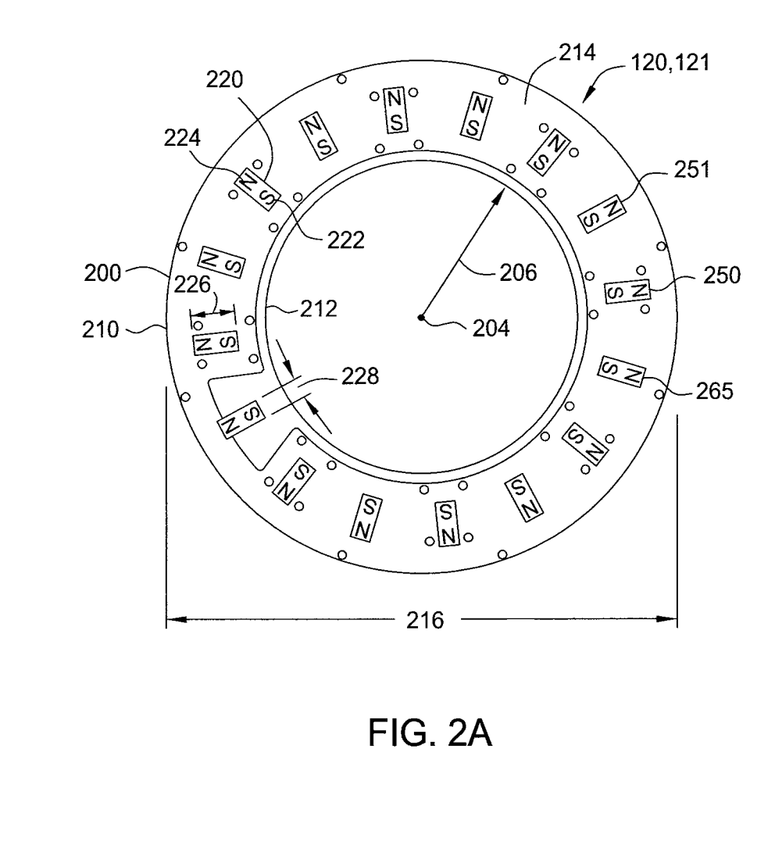
FIG. 2A and FIG. 2B are a schematic top plan views of a magnetic ring suitable for tuning a magnetic field.
Figure 2B:
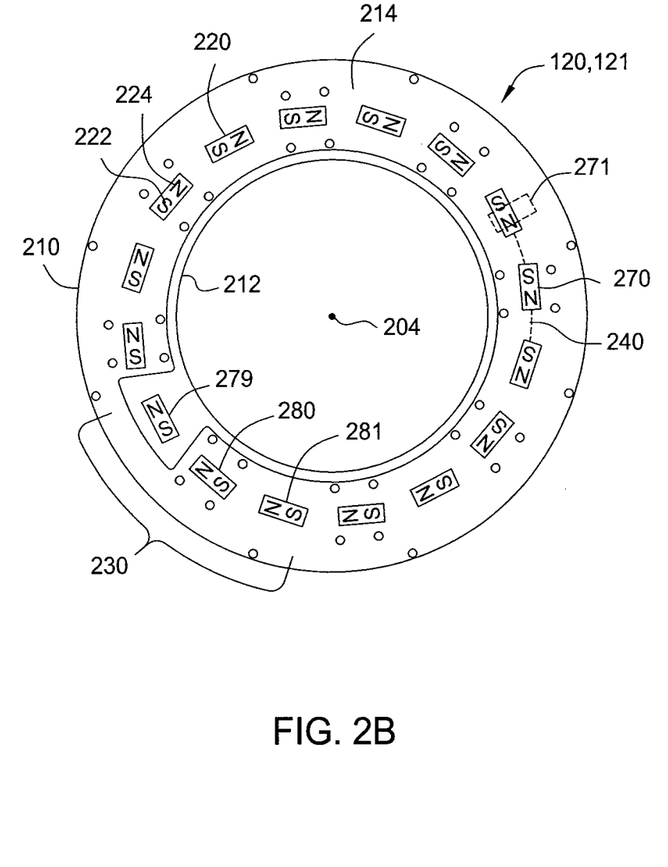

Turning to FIG. 2A and FIG. 2B, schematic top plan views of the magnetic ring 200 are illustrated in greater detail. The magnetic ring 200 (i.e., upper magnetic ring 120 or lower magnet array 121) may have a plurality of magnets 220. The magnetic ring 200 has a center 204, an inner diameter 212 and an outer diameter 210. The magnetic ring 200 has a bottom surface 214 upon which one or more of the magnets 220 may be disposed thereon.

The magnets 220 have poles or regions which the lines of magnetic induction converge (South Pole 222) or diverge (North Pole 224). The magnets 220 may have a length 226 greater than an inch and have a diameter 228 greater than about a half of an inch, or other suitable dimensions. The magnetic field is most distal from the magnet 220 at the regions furthest away from the poles, 222, 224. The magnets 220 may be oriented in a manner that maximizes or minimizes the magnetic force. In one embodiment, the magnets 220 may be oriented along a radius 206, i.e., radially, (as shown in FIG. 2A) to generate a maximum magnetic field on the edge of the substrate. In another embodiment, the magnets 220 may be oriented along an arc 240, i.e., azimuthally, (as shown in FIG. 2B) to generate a minimum magnetic field on the edge of the substrate. In yet another embodiment, the magnets 220 may be individually oriented without respect to other magnets 220 on the magnetic ring 200. For example, a magnet 270 may be oriented azimuthally while an adjacent magnet 271 may be oriented radially.

In one embodiment, there are 16 permanent magnets equally spaced on the bottom surface 214 of the magnetic ring 200. In another embodiment, the magnetic ring 200 may have a finite number of magnets 220 located in only a portion 230 of the magnetic ring. For example, a first magnet 279, second magnet 280 and third magnet 281 may be located in the portion 230 of the magnetic ring 200 to slightly bias the plasma toward a corresponding area of the substrate for enhancing the etch rate in that area and providing more uniformity to the etch rate over the entire substrate surface. It should be appreciated that any number of magnets 220 may be oriented azimuthally or radially and disposed in any location on the bottom surface 214 of the magnetic ring 200.

The magnets 220 may be permanently fixed on the magnetic ring 200 such that predictable results are achieved. Alternately, the magnets 220 may be adjusted, i.e., rotated, removed, or switched between an on state and an off state, to provide the magnetic ring 200 tunable capabilities for the plasma profile. Advantageously, the plasma processes, such as deposition or etch process, may be made substantially uniform from center to edge of the substrate and skew from the chamber can be corrected.

Figure 3:
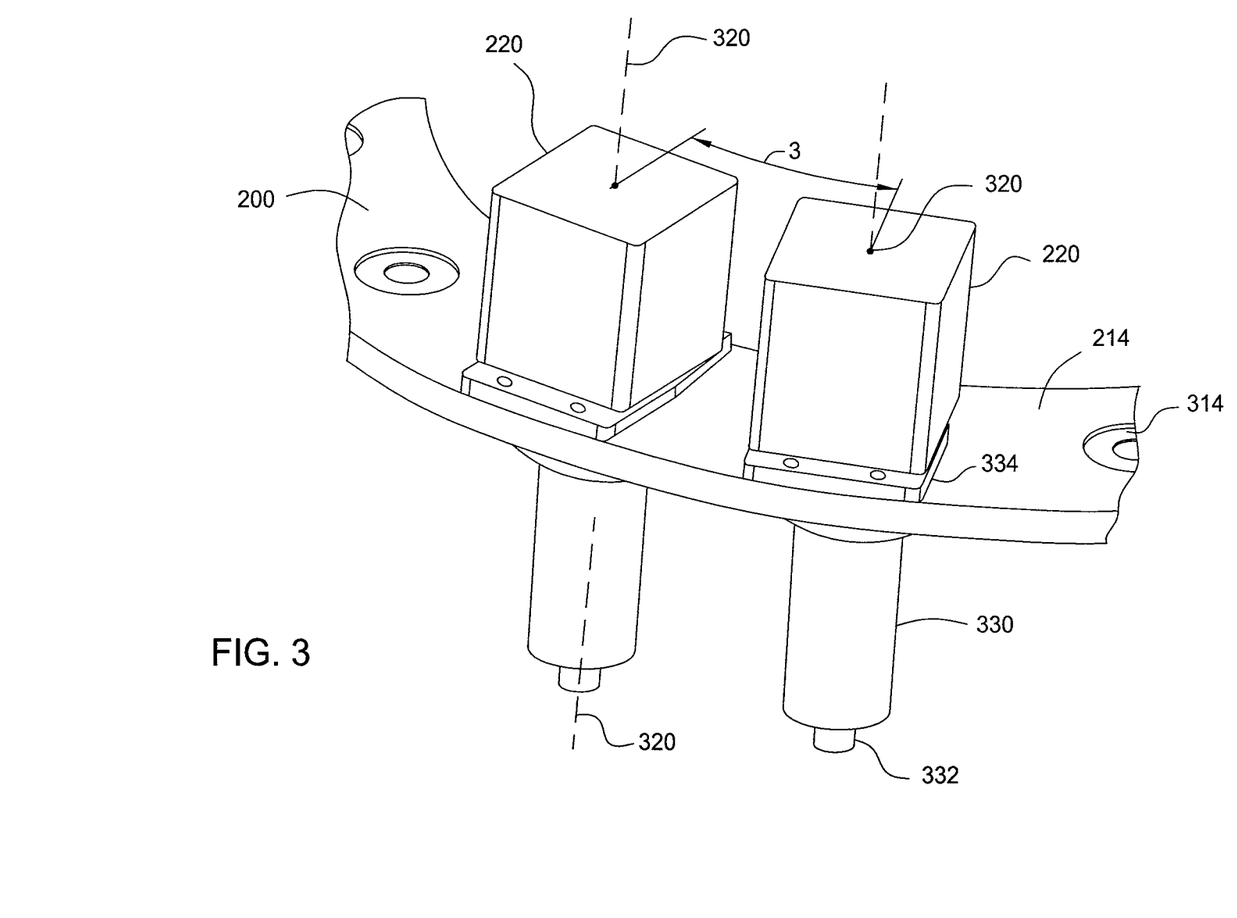
FIG. 3 illustrates a perspective view of a portion of the magnetic ring having magnets configured to rotate independently.

FIG. 3 illustrates a portion of the magnetic ring 200 having magnets 220 configured to rotate independently about an independent axis of rotation 320. The magnetic ring 200 may have a plurality of through hole bushings 314. Each through hole bushing 314 is configured to receive a spindle 332. The spindle 332 has a head 334 on which the magnets 220 are supported. The center of the through hole bushing 314 and thus the spindle 332 is aligned with the independent axis of rotation 320 for each magnet 220.

In one embodiment, the magnetic ring has an outside diameter greater than the substrate 118 and has a plurality of magnets 220, each having a respective actuator 330. The axis of rotation 320 for each of the magnets 220 may be adequately spaced a distance 316 from the axis of rotation 320 for an adjacent magnet 220 to permit each magnet 220 to rotate. Advantageously, individual magnets 220 may be rotated to adjust the strength of the magnetic field along the magnetic ring 200 for fine tuning the profile for the density of the plasma radicals and thus a flatter topology for the surface profile of a substrate subjected to the plasma for processing. The independent control of the magnets 220 at discrete locations, provide tunable control of the plasma profile laterally across the substrate. Controls of the plasma profile in turn results in discrete independent control of etch and deposition rates at each location on the substrate to provide a uniform surface profile.

Actuators 330 may operate to rotate individual spindles 332 and thus each individual magnet 220. The magnets 220 may be rotated between a maximum magnetic field, with the poles oriented radially, and a minimum magnetic field, with the poles oriented azimuthally. The actuator 330 may partially rotate one or more magnets 220 to fine tune a plasma profile. The actuator 330 may be a stepper motor, such as a NEMA 17 motor or equivalent. Alternately, the actuator 330 may be a pneumatic motor, an electric motor, a relay, or other suitable device. The actuator 330 may directly drive the magnet, in which case the spindle 332 may be the motor drive shaft. Alternately, the actuator 330 may have a gear, pulley, idler, or other mechanism (not shown) for connecting the movement of the actuator 330 to the rotational movement of the spindle 332.

Figure 4A:
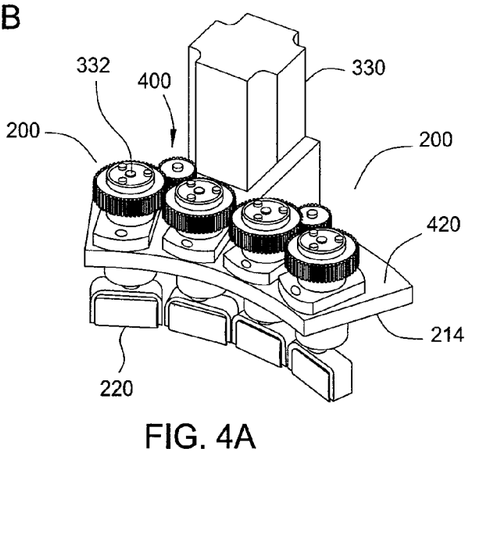
FIGS. 4A-4C illustrate different partial views of a ring for rotating groups of magnets.
Figure 4B:
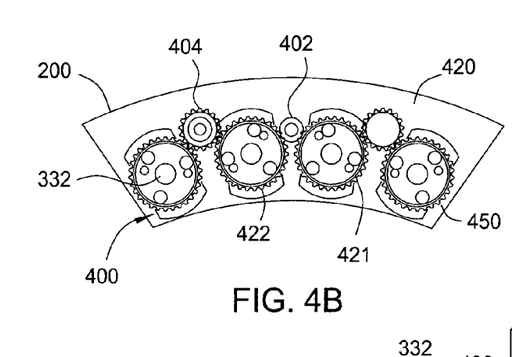
Figure 4C:
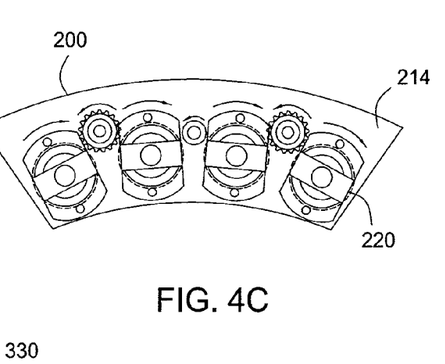

FIGS. 4A-4C are schematic drawings illustrating rotating groups of magnets 220. FIG. 4A is a perspective view for an underside of a rotation unit 400. FIG. 4B is a plan top view of the magnetic ring 200 having the rotation unit 400. FIG. 4C is a plan bottom view of the magnetic ring 200 having the rotation unit 400. The rotation unit 400 is configured to couple two or more magnets 220 to the actuator 330. For example, the rotation unit 400 may be disposed on a top surface 420 of the magnetic ring and couple four magnets 220 on the bottom surface to the single actuator 330.

The rotation unit 400 may have a plurality of connecting members 450, idlers, pulleys or other suitable means for transferring rotational motion to the spindle 332. The connecting members 450 may be molded, printed or machined using powder metal or plastic. The connecting members 450 may include a mix of one or more of planetary gear, helical gear, spur gear, bevel gear, worm gear, rack and pinion, or other suitable gear. For example, a drive gear 402 may be a spur gear configured to engage a first hub gear 422 and a second hub gear 421 attached to the spindles 332 on which the magnets 220 are mounted. Linkage gears 404 may lock the rotation of the connecting members 450 such that the drive gear 402 drives a plurality of connecting members 450. The gear ratio between the drive gear 402 and the hub gears 421, 422 may be about 4:1 for example. In one embodiment, the drive gear 402 drives four connecting members 450 and thus rotates four magnets 220 on the bottom 214 of the magnetic ring 200.

The actuator 330 may be a stepping or other type of motor. The actuator 330 may be coupled to the drive gear 402 for rotating the magnets 220 about 360 degrees. The actuator 330 may have a communication/control interface for providing instructions to the actuator 330 from a controller, such as the controller 122 for the processing chamber 100. In one embodiment, the magnetic ring has 24 magnets 220. In one embodiment, the actuator 330 may be an electric motor which rotates a spur gear (drive gear 402 of the rotation unit 400) to effect the rotation of one or more of the hub gears 421, 422 through 360 degrees which in turn rotates the magnets 220 through 360 degrees. In a second embodiment, the actuator 330 may be a stepping motor which rotates a pinion (drive gear 402 of the rotation unit 400) to effect the movement of a rack (linkage gears 404). The rack may in turn effect the rotation of the hub gears 421, 422 which in turn rotates the corresponding magnets 220. The rotation unit 400 beneficially reduces the costs of the magnetic ring 200 by reducing the number of actuators 330 needed to rotate the magnets 220.

Figure 5:
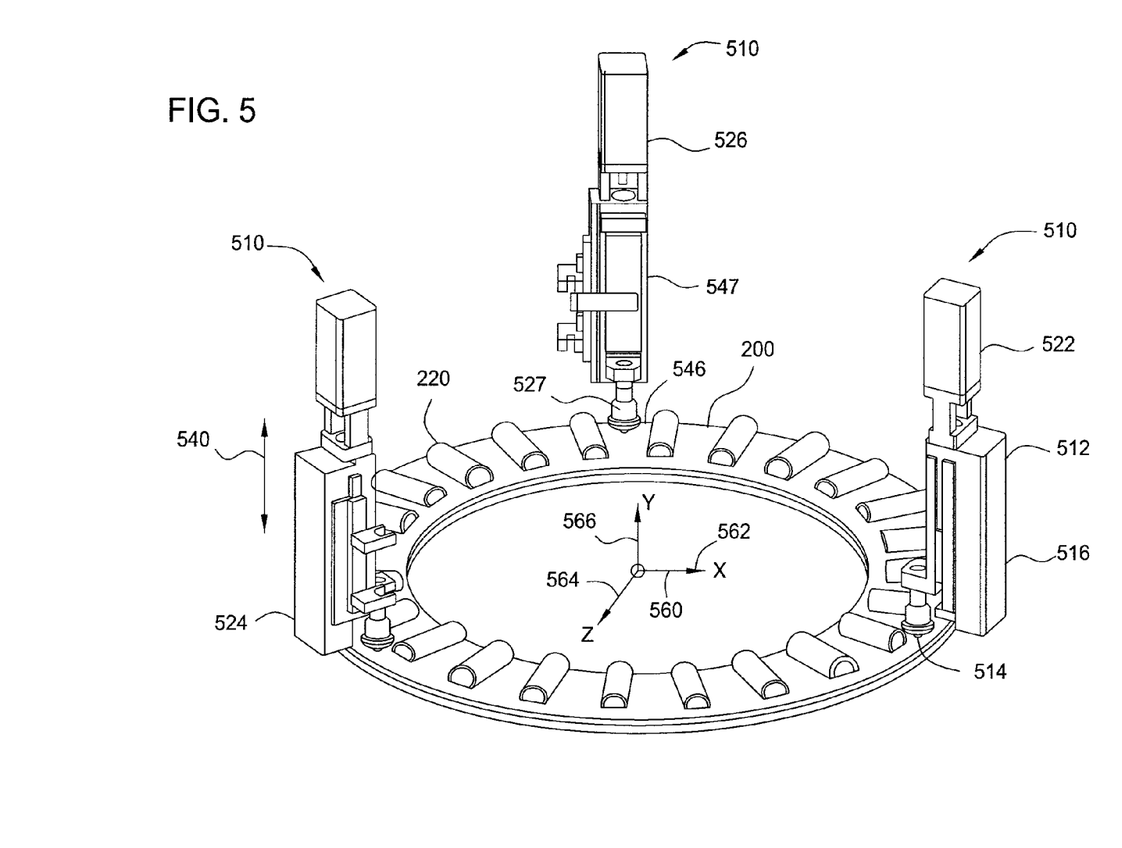
FIG. 5 illustrates a perspective view of a lift and tilt mechanism for the magnetic ring.

FIG. 5 is a perspective view of a lift and tilt mechanism 510 for the magnetic ring 200. The lift and tilt mechanism 510 may be attached to the magnetic ring 200. The lift and tilt mechanism 510 may include one or more lifting actuators 512 with each actuator attached at one end 514 to the magnetic ring 200 and at a second end 516 to the processing chamber, such as to the lid 158 of the processing chamber 100 of FIG. 1. Alternately, the lift and tilt mechanism 510 may include one or more wedges (not shown) places between the magnetic ring 200 and the lid 158.

The lifting actuators 512 may be a linear actuator or other actuator suitable for moving the magnetic ring 200 in a vertical direction 540. The lifting actuators 512 may raise or lower the magnetic ring 200 above the lid to effect the distance the magnetic ring 200 is from the plasma. In one embodiment, the lifting actuators 512 work in unison. For example, lifting actuators 512 may raise the magnetic ring 200 above the lid to decrease the effect of the magnetic field on the plasma. Likewise, the lifting actuators 512 may lower the magnetic ring toward the lid 158 to increase the effects of the magnetic field from the magnetic ring 200 on the plasma and increase the density of the plasma in the magnetic field.

In another embodiment, the lifting actuators 512 may operate independently to tilt the magnetic ring 200 and thus increase the effect of the magnetic field in the location where the magnetic ring 200 is most proximate the lid 158. In one example, lift and tilt mechanism 510 has three the lifting actuators 512 equally spaced apart in a coordinate arrangement 560. The three lifting actuators 512 may move in unison to move the magnetic ring along a Z-axis 566. Alternately, the three lifting actuators 512 may start at a first position 546 and a first lifting actuator 526 may move the magnetic ring 200 at a first location 527 from the first position 546 to a second position 547. A second lifting actuator 522 and a third lifting actuator 524 may remain of the coordinate at the first position 546 resulting in a tilt of the magnetic ring with the magnetic field at the first location 527 having less influence on the plasma density than other locations along the magnetic ring 200. Thus is can be seen that by adjusting the first, second and third lifting actuators 526, 522, 524, independently from each other, the magnetic field may be increased in some areas and lessened in other to tune the plasma profile. It should also be appreciated that the magnets 220 attached to the magnetic ring 200 may be fixed or have one of the means of rotation previously discussed.

Figure 6A:
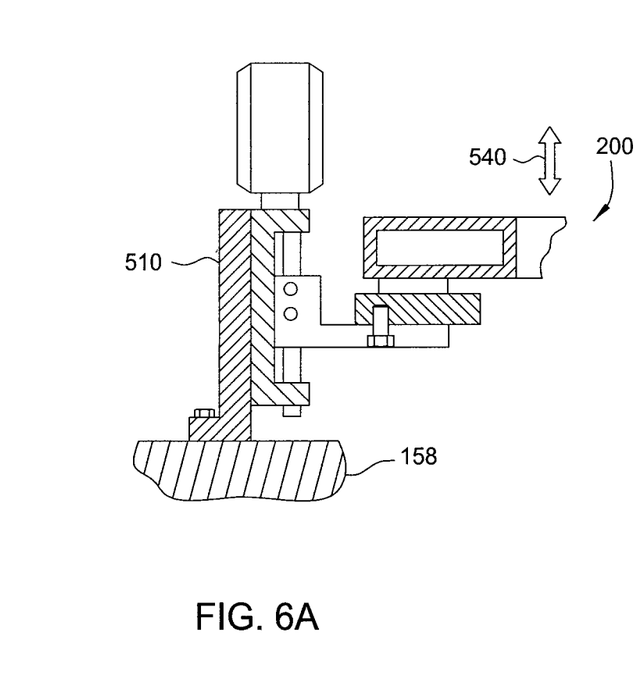
FIGS. 6A-6B illustrate a ring rotation mechanism for the magnetic ring.
Figure 6B:
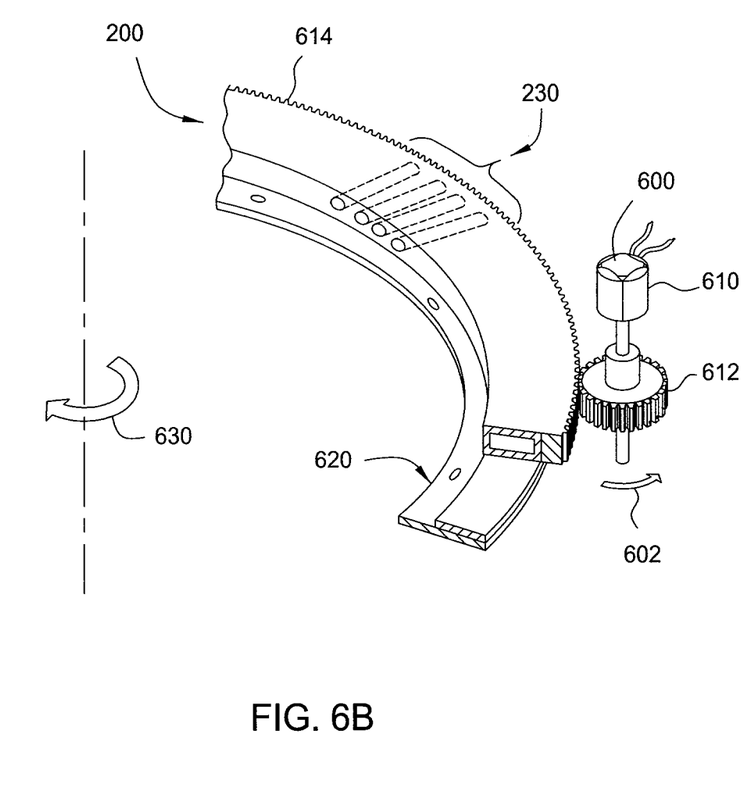

FIGS. 6A and 6B illustrate a ring rotation mechanism 600 for the magnetic ring 200. FIG. 6A illustrates the ring rotation mechanism 600. FIG. 6B illustrates one means of integrating the ring rotation mechanism 600 with the lift and tilt mechanism 510. The ring rotation mechanism 600 may have a ring rotation actuator 610. The ring rotation actuator 610 may be an electric motor or other suitable actuator for providing rotational movement to the magnetic ring 200. The ring rotation actuator 610 may be controlled by the controller 122. For example, the controller 122 may provide power to cause the ring rotation actuator 610 to rotate in a counter clockwise manner (as shown by arrow 608) and causes the magnetic ring 200 to rotate in a clockwise direction (as shown by arrow 630) for a set number of degrees. Or the controller 122 may provide the power in a reverse polarity to cause the ring rotation actuator 610 to rotate the magnetic ring 200 in a counter-clockwise direction.

The ring rotation actuator 610 may have an output shaft 616 attached to a linkage connector 612. The linkage connector 612 has a corresponding ring connector 614. The linkage connector 612 may be a gear, idler, belt and pulley, or other suitable means for transferring motion from the ring rotation actuator 610 to the magnetic ring 200. In one embodiment, the linkage connector 612 is a spur gear and is configured to drive a plurality of teeth (ring connector 614) along the outside perimeter of the magnetic ring 200. Alternately, the linkage connector 612 may be a friction idler, such as a rubber wheel, which transfers the rotation from ring rotation actuator 610 directly to the magnetic ring 200.

The magnetic ring 200 may be disposed on a turntable ring 620. The turntable ring 620 may slideably support the magnetic ring 200 such that the magnetic ring 200 and the turntable ring 620 move independently from each other. Additionally, the turntable ring 620 may support the ring rotation mechanism 600. Thus, the ring rotation mechanism 600 may move the magnetic ring 200 relative to the turntable ring 620.

The turntable ring 620 may be supported by the lift and tilt mechanism 510 as shown in FIG. 6A. The lift and tilt mechanism 510 may move the turntable ring 620 in a vertical direction 540 and tilt the turntable ring 620 and thus, the magnetic ring 200 residing thereon. The ring rotation actuator 610 is attached to the turntable ring 620 and thus is tilted along with the turntable ring 620 such that alignment of the linkage connector 612 and corresponding ring connector 614 is maintained.

The portion 230 of the magnetic ring 200 may have four magnets 220 for biasing the plasma in a corresponding area. The magnetic ring 200 may be rotated and tilted to adjust the magnetic field strength in the interior processing region 150 for tuning the plasma therein. Thus, fine tune control of the plasma profile may be obtained for controlling the substrate surface profile.

Figure 7:
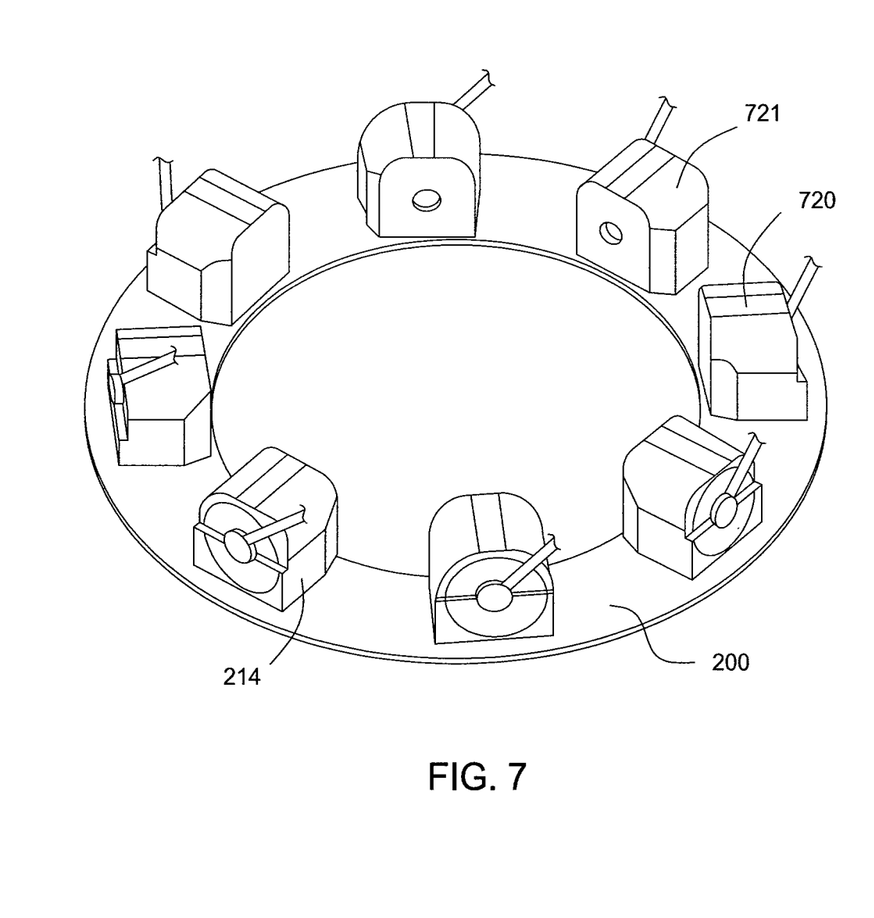
FIG. 7 is a perspective view for the magnetic ring having electromagnets suitable for tuning a magnetic field.

FIG. 7 is a perspective view for a magnetic ring 200 having electromagnets 720 suitable for tuning a magnetic field. The magnetic ring may 200 may have one or more electromagnets 720. The electromagnets 720 may be switched between an on position wherein a magnetic field is created, and an off position, wherein the electromagnet 720 has no magnetic field. However, unlike a permanent magnet that needs no power, an electromagnet requires a continuous supply of electrical energy to maintain a magnetic field. The electromagnets 720 may have a variable magnetic field. A controller, such as controller 122, may be attached to and adjust the power to the electromagnet 720 to decrease the electromagnetic field from a maximum incrementally down to no electromagnetic field. Additionally, the polarity of the magnetic field may be reversed by the controller 122. Each electromagnet 720 may be individually attached to the controller 122 and thus independent from adjacent electromagnets 720. Thus, the electromagnet 720 can fine tune the magnetic field in and around discrete locations along the magnetic ring 200. Increasing the power of a single electromagnet 720, such as a first electromagnet 721, has the effect of increasing the plasma ion density nearest the first electromagnet 721. In one embodiment, eight electromagnets 720 are equally spaced around the magnetic ring 200 and individually attached to the controller 122. Advantageously, the magnetic field can be quickly changed by controlling the amount of electric current to the electromagnet 720. The magnetic field may then tune the plasma profile with minimal hardware.

Figure 8:
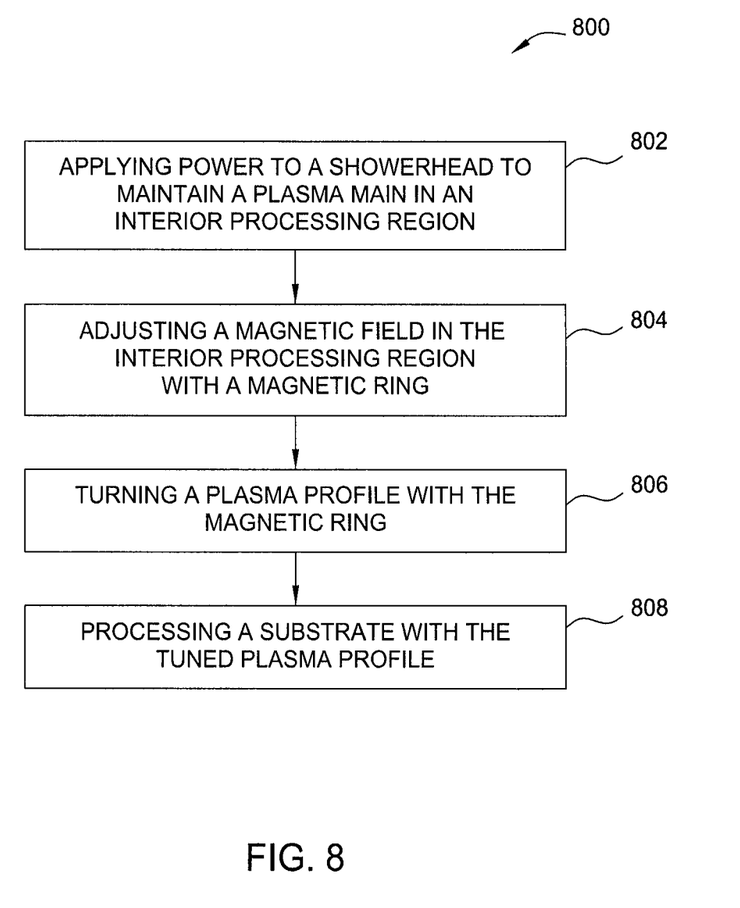
FIG. 8 is a method for using the magnetic ring to tune a plasma profile for processing a substrate.

FIG. 8 is a method 800 for using the magnetic ring to tune a plasma profile for processing a substrate. The method 800 begins at block 802 by applying power to a showerhead to maintain a plasma in an interior processing region. At block 804, a magnetic field is adjusted in the interior processing region with a magnetic ring. The magnetic ring may be sized according to a substrate. The magnetic ring may be positioned concentrically with a centerline of the substrate. One or more magnets may be disposed on the magnetic ring to form a magnetic field in the interior processing region. The magnetic field may further be adjusted by: rotating the magnets individually or in groups on the magnetic ring; turning on or off the magnetic field of the magnets (electromagnets); rotating the magnetic ring; raising or lowering the magnetic ring; or tilting the magnetic ring. Additionally, several of the aforementioned actions may be taken together to fine tune the magnetic field.

At block 806, a plasma profile is tuned with the magnetic field. The magnetic field alters the ion density. Creating a particular magnetic field with the magnetic ring, creates a particular profile for the plasma density which may be utilized to compensate for other process non-uniformities within the processing chamber, thereby enhancing the ability to obtain more uniform processing results. At block 808, a substrate is processed with the tuned plasma profile. The areas of higher plasma density correspond to areas having a stronger magnetic field. Corresponding areas of the substrate will have a greater number of plasma ions interacting with the substrate surface. Advantageously, the plasma profile may be alter to obtain a desired surface profile on the substrate.

Accordingly, it has been found that independent control of the magnetic field coupling to the plasma at discrete locations laterally across the substrate allows the etch and deposition rates to be independently controlled at each location on the substrate. Thus, the control of variation in the plasma profile in the processing environment may be compensated to achieve desired processing uniformity of the substrate processed therein to less than about 10%, resulting in control of process deviations in layer uniformities down to about 5 Å.

While the foregoing is directed to implementations of the present disclosure, other and further implementations of the disclosure may be devised without departing from the basic scope thereof, and the scope thereof is determined by the claims that follow.

We claim:
1. A magnetic ring, comprising:
   a body having a top surface and a bottom surface;
   a plurality of magnets disposed on the bottom surface of the body, the magnets configured to generate a non-uniform magnetic field with respect to a centerline of the ring; and
   a rotation mechanism operable to rotate a first magnet of the plurality of magnets, wherein the rotation of the first magnet is independent of the bottom surface.
2. The magnetic ring of claim 1, wherein the at least one rotation mechanism comprises a plurality of rotation mechanisms, each rotation mechanism operable to rotate a respective one of the magnets.
3. The magnetic ring of claim 1, wherein the at least one rotation mechanism is operable to rotate the at least 2 or more magnets.
4. The magnetic ring of claim 3, wherein the rotation mechanism comprises:
   a plurality of gears.
5. The magnetic ring of claim 1 further comprising:
   a lift and tilt mechanism coupled to the body.
6. The magnetic ring of claim 1, wherein at least one of the magnets is an electromagnet.
7. The magnetic ring of claim 1, wherein the magnets are non-uniformly distributed around the body.
8. The magnetic ring of claim 1 further comprising:
   a ring rotation mechanism operable to rotate the body.
9. A processing chamber comprising:
   chamber body having a lid, bottom and walls defining an interior processing region;
   a showerhead disposed under the lid in the interior processing region, wherein the showerhead is configured to support a plasma within the interior processing region;
   an electrostatic chuck (ESC) disposed in the chamber body; and
   a magnetic ring disposed on the lid, the magnetic ring comprising:
      a body having a top surface and a bottom surface; and
      a plurality of magnets disposed on the bottom surface of the body, the magnets configured to generate a non-uniform magnetic field with respect to a centerline of the ring; and
      a rotation mechanism operable to rotate a first magnet of the plurality of magnets, wherein the rotation of the first magnet is independent of the bottom surface.
10. The processing chamber of claim 9, wherein the at least one rotation mechanism comprises a plurality of rotation mechanisms, each rotation mechanism operable to rotate a respective one of the magnets.

11. The processing chamber of claim 9, wherein the at least one rotation mechanism is operable to rotate the at least 2 or more magnets.

12. The processing chamber of claim 11, wherein the rotation mechanism comprises a plurality of gears.

13. The processing chamber of claim 9, wherein the magnetic ring further comprises:
a lift and tilt mechanism coupled to the body.

14. The processing chamber of claim 9, wherein at least one of the magnets is an electromagnet.

15. The processing chamber of claim 9, wherein the magnets are non-uniformly distributed around the body.

16. The processing chamber of claim 9, wherein the magnetic ring further comprises:
a ring rotation mechanism operable to rotate the body.

* * * * *